(12) United States Patent
Shih

(10) Patent No.: US 7,454,531 B2
(45) Date of Patent: Nov. 18, 2008

(54) USB PORTABLE STORAGE CAPABLE OF BEING UPGRADED AND CAPACITY-EXPANDED FREELY BY REPLACEMENT OF STORAGE MEDIUM

(75) Inventor: Hsuan-Ming Shih, Chungli (CN)

(73) Assignee: Taiguen Technology (Shen_Zhen) Co., Ltd., Shenzhen (CN)

( * ) Notice: Subject to any disclaimer, the term of this patent is extended or adjusted under 35 U.S.C. 154(b) by 388 days.

(21) Appl. No.: 10/502,269

(22) PCT Filed: Jun. 27, 2002

(86) PCT No.: PCT/CN02/00447

§ 371 (c)(1),
(2), (4) Date: Jul. 20, 2004

(87) PCT Pub. No.: WO03/063174

PCT Pub. Date: Jul. 31, 2003

(65) Prior Publication Data

US 2005/0105346 A1     May 19, 2005

(30) Foreign Application Priority Data

Jan. 23, 2002    (CN) .......................... 2002 2 01097 U

(51) Int. Cl.
G06F 1/00 (2006.01)
G06F 13/00 (2006.01)
G06F 3/00 (2006.01)
H04L 9/10 (2006.01)

(52) U.S. Cl. .............................. 710/13; 710/8; 710/63; 710/72; 710/73; 710/74; 710/105; 710/301; 711/103; 711/115; 711/165; 716/185; 716/172; 726/9; 726/19; 726/20; 726/34

(58) Field of Classification Search .................. 710/8, 710/13, 63, 105, 72–74, 301; 711/103, 115, 711/165; 713/185, 172; 726/9, 19, 20, 34
See application file for complete search history.

(56) References Cited

U.S. PATENT DOCUMENTS 6,216,230 B1 * 4/2001 Rallis et al. ................. 713/185
6,234,844 B1 * 5/2001 Somerville et al. .......... 439/630

(Continued)

FOREIGN PATENT DOCUMENTS

WO    WO 01/39102    * 11/2001

*Primary Examiner*—Tammara R Peyton
(74) *Attorney, Agent, or Firm*—J.C. Patents

(57) ABSTRACT

An USB removable memory with replaceable storage medium for optional upgrade and extension of the storage capacity, including an USB connector, a controller and a flash memory; said USB connector and said controller are integrated as a memory body; the flash memory as the physically-independent storage component is attached to the body, and is electrically connected to the controller. A dismountable back cover is provided in the rear of the housing of the body; a chamber for flash memory part is provided in the body; a flash memory is placed in the chamber; the electrical connection between said flash memory part and said controller is elastic tip-touch connection or plug-in connection. The flash memory is a independent part according to the present invention, which can be mounted/unmounted conveniently onto/from the body, so the memory can be optionally upgraded and extended in its storage capacity, it is convenient for user, the cost is reduced, and the resource is saved.

4 Claims, 4 Drawing Sheets

U.S. PATENT DOCUMENTS

| | | | |
|---|---|---|---|
| 6,438,638 B1 * | 8/2002 | Jones et al. | 710/301 |
| 6,654,841 B2 * | 11/2003 | Lin | 710/301 |
| 6,763,399 B2 * | 7/2004 | Margalit et al. | 710/13 |
| 6,772,233 B2 * | 8/2004 | Iida et al. | 710/13 |
| 7,011,247 B2 * | 3/2006 | Drabczuk et al. | 235/451 |
| 7,039,759 B2 * | 5/2006 | Cheng et al. | 711/115 |
| 7,039,780 B2 * | 5/2006 | Taussig et al. | 711/165 |
| 2002/0147882 A1 * | 10/2002 | Pua et al. | 711/103 |
| 2002/0185533 A1 * | 12/2002 | Shieh et al. | 235/441 |
| 2006/0208066 A1 * | 9/2006 | Finn et al. | 235/380 |

* cited by examiner

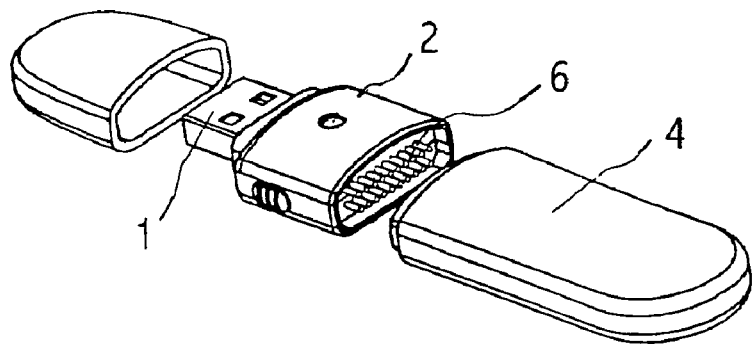
Fig. 4
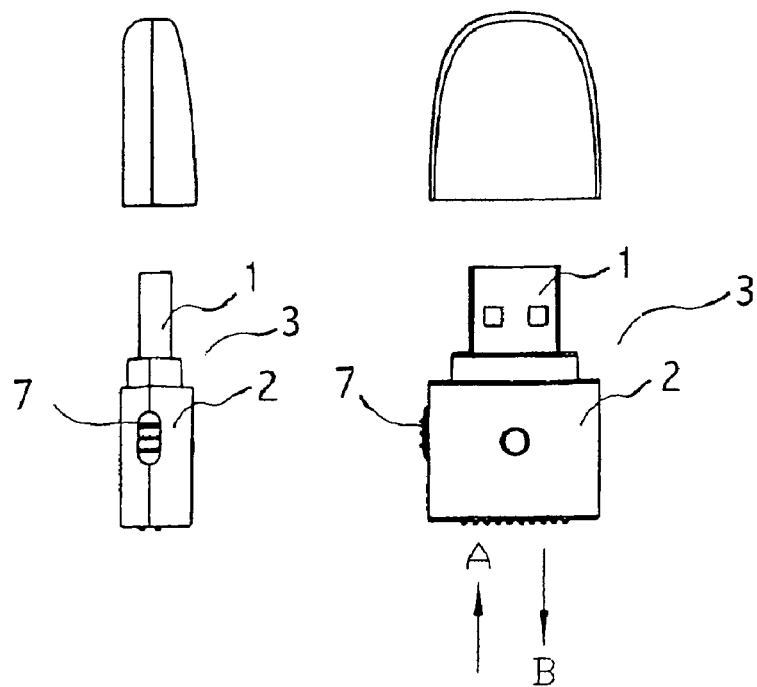
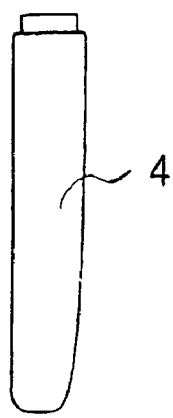
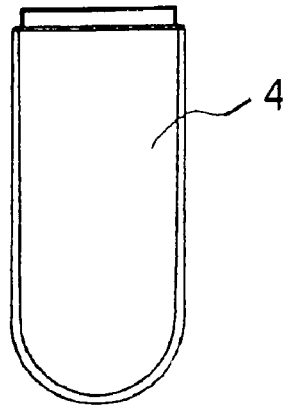
Fig. 5  Fig. 6

USB PORTABLE STORAGE CAPABLE OF BEING UPGRADED AND CAPACITY-EXPANDED FREELY BY REPLACEMENT OF STORAGE MEDIUM

CROSS-REFERENCE TO RELATED APPLICATIONS

This application is a national stage application of international application PCT/CN02/00447 filed on Jun. 27, 2002, which claims priority benefit of Chinese application No. CN02201097.1 filed on Jan. 23, 2002. This application is a continuation-in-part, and claims priority benefit, of application Ser. No. 10/500,421 filed on Jun. 25, 2004, which is a national stage application of international application PCT/CN02/00546 filed on Aug. 7, 2002, which claims the priority benefit of Chinese application No. CN01279675.1 filed on Dec. 29, 2001, CN01279676.X filed on Dec. 29, 2001, CN02201096.3 filed on Jan. 23, 2002, and CN02238009.4 filed on Jun. 27, 2002.

TECHNICAL FIELD

The present invention relates to a removable memory using USB connector, particularly to an USB removable memory with replaceable storage medium for optional upgrade and extension of the storage capacity.

PRIOR ART

USB (Universal Serial Bus) technology is a newer kind of interface technology which is widely used in the field of PC in resent years step by step. USB technology consists of three parts: PC system with USB interface, system software supporting USB, and device using USB interface. "Universal Serial Bus" (USB 2.0) is a specification for connection of computer peripheral, which is worked out by some big PC enterprises including Compaq, HP, Intel, Lucent, Microsoft, NEC and Philips. USB 1.1 specification is now general adopted, whose speed is 100 times faster than that of standard serial port, and which supports simultaneous connection of multi-device and possesses real "plug-and-play" feature. Now, USB is accepted gladly by peripheral manufacturers due to these advantages.

On the other hand, the FLASH (flash memory) as a non-volatile storage medium has much higher performance in respect of data stability and adaptability of environment than magnetic storage medium, and has distinctly overcome the disadvantages of complex mechanism and small storage capacity of the floppy drive and floppy disk. Therefore, while the production cost of semiconductor is reduced, the removable memory using USB interface technology and flash memory technology is wide applied. Such products in the prior art includes the following parts: USB interface, controller, flash memory unit. The controller is electrically connected to the USB interface and the flash memory. Such product is provided with a housing, in which the flash memory and the controller are fixedly placed. The USB interface protrudes from the housing. As a end product, the capacity of such product is fixed. It is necessary to buy a completed USB memory when a memory with larger capacity is needed. On the other hand, the completed USB memory must be throw away if the flash memory or the controller has any problem. As a result, a variety of requirements cannot be satisfied, and wasting is done.

SUMMARY OF THE INVENTION

The object of the present invention is to provide a USB removable memory with replaceable storage medium for optional upgrade and extension of the storage capacity, wherein the flash memory part can be physically separated from the controller and the USB interface connected with the controller, and the flash memory part can be conveniently plugged/unplugged onto/from the memory body.

Another object of the present invention is to provide a USB removable memory with replaceable storage medium for optional upgrade and extension of the storage capacity, wherein the controller can be neatly connected to other device needed to connect with a computer by USB port.

The above-mentioned objects are achieved through the following technical solution:

An USB removable memory with replaceable storage medium for optional upgrade and extension of the storage capacity, including an USB connector, a controller and a flash memory; wherein, the USB connector and the controller are integrated as a memory body; the flash memory as the physically-independent storage component is attached to the body, and is electrically connected to the controller; said body is provided with write/read status control switch.

Said flash memory part is mounted on the body by means of guide channel, and the electrical connection between them is elastic tip-touch connection. Certainly, the electrical connection between the flash memory part and the body may be the plug-in connection or elastic fastener connection.

In addition, a dismountable back cover is provided in the rear of the housing of the body. The body is provided with a chamber for flash memory part, a flash memory is placed in the chamber.

furthermore, the electrical connection between said flash memory part and said body is achieved by means of universal interface, such as USB interface or SMMC.

The back cover can be mounted on the body by means of guide channel or clasp according to the requirement.

The present invention possesses following obvious advantages in comparison with the prior art.

The memory can be optionally upgraded and extended in its storage capacity, so it is convenient for user, the cost is reduced, and the resource is saved.

The flash memory as independent spare part is replaceable, similar to the battery of mobile terminal which is mounted in the mobile terminal replaceablely.

It is very convenient to mount and dismount the flash memory part.

Because the USB interface and the controller in the present invention are standard-opened components, the controller can also connect with other parts which are needed to connected with a computer, such as the infrared-ray receiver as wireless transmission equipment and the seat of IC card.

DESCRIPTION OF FIGURES

FIG. 4 is an exploded explanatory diagram showing another embodiment of the present invention;

FIG. 5 is a diagram showing the structure of the side of the device shown in FIG. 4;

FIG. 6 is a diagram showing the structure of the front of the device shown in FIG. 4;

MODE OF CARRYING OUT THE INVENTION

The present invention will be explained in detail with reference to the drawings and concrete embodiments.

Figure 10:
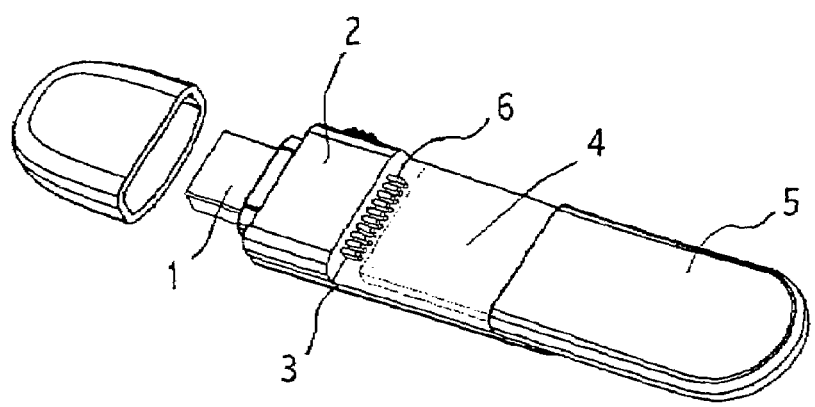
FIG. 10 is an exploded explanatory diagram showing still further embodiment of the present invention.
Figure 11:
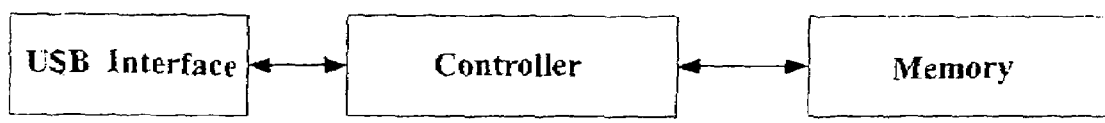
FIG. 11 is a block diagram showing the electrical connection of the present invention.

As shown in FIG. 1-10, the present invention is an USB removable memory with replaceable storage medium for optional upgrade and extension of the storage capacity. It includes an USB connector 1, a controller 2 and a flash memory 3. Wherein, the USB connector 1 and the controller 2 are integrated as a memory body 3. The flash memory 4 as the physically-independent storage component is attached to the body 3, and is electrically connected to the controller 2. The data transmission can be completed by using the standard interface protocol, such as the USB, I2C. The electrical connection are shown in FIG. 11. Therefore, the storage component can be replaced optionally, so as to meet the various requirements. For example, when the capacity of the flash memory 4 is not enough, the flash memory 4 can be replaced just with a larger one having larger capacity of storage, or the flash memory 4 can be replaced with a plurality of flash memory parts, while one USB connector 1 and one controller 2 are still used. In this way, not only the flexibility of the USB removable memory is improved in respect of extension of the storage capacity, but also the cost of the USB removable memory is largely reduced, so the resource of component is saved.

Figure 1:
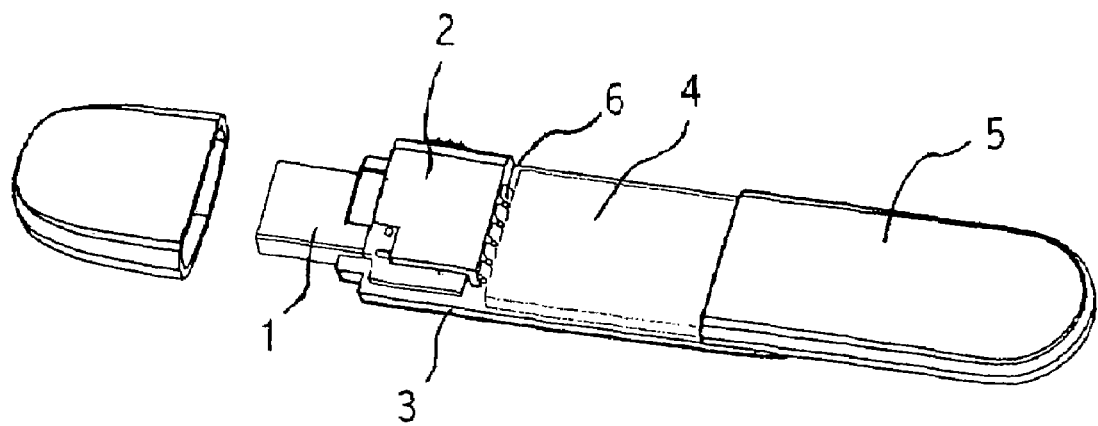
FIG. 1 is an exploded explanatory diagram showing one embodiment of the present invention.
Figures 2, 3:
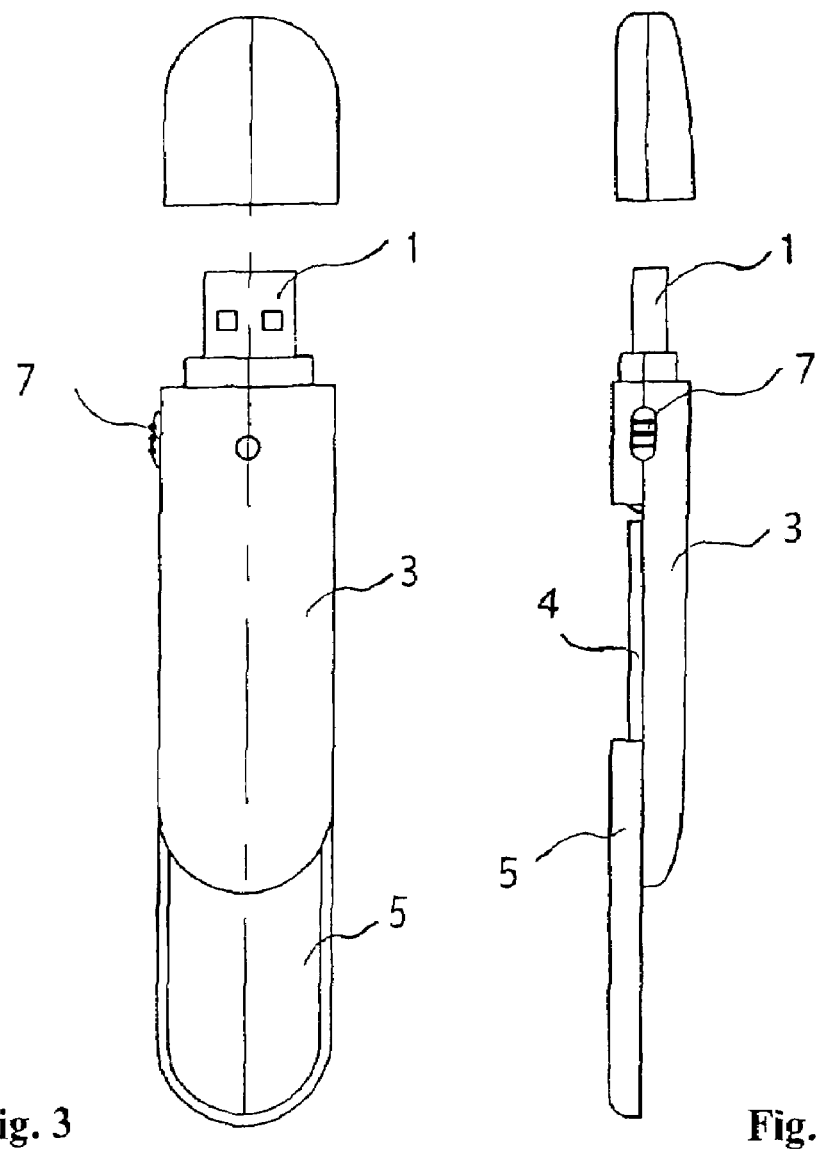
FIG. 2 is a diagram showing the structure of the side of the device shown in FIG. 1.
FIG. 3 is a diagram showing the structure of the front of the device shown in FIG. 1.

The concrete embodiment is as follows:

Refer to FIGS. 1, 2 and 3, a dismountable back cover 5 is provided in the rear of the housing of the body 3 according to the present invention, which can be opened and closed. Specifically, the back cover 5 can be mounted on the body 3 by means of guide channel, and can slid on the guide channel, as shown in FIG. 1, 10. Certainly, the back cover 5 can be provided with elastic fastener such as clip and tenon which can fasten the back cover 5 onto the body 3. The body 3 is provided with a chamber for flash memory part 4, a flash memory part 4 is placed in the chamber, and the back cover 5 covers the chamber. The electrical connection 6 between the flash memory part 4 and the controller 2 is elastic tip-touch connection. The electrical connection 6 as shown in FIG. 10 is plug-in connection. When the flash memory part 4 is needed to replace, the whole procedure is the following: opening the back cover 5; then take out the flash memory part 4; finally put a new flash memory part 4 in the correct position in the chamber.

Furthermore, the body 3 is provided with write/read status control switch 7.

The flash memory part 4 is also integrated with the back cover 5. The flash memory part 4 is mounted on the body 3 by means of guide channel or fastener. The electrical connection 6 can be either the elastic tip-touch connection or plug-in connection.

Another embodiment of the present invention is shown in FIGS. 4, 5 and 6. In the embodiments, the flash memory part 4 is a self-housing independent part, whose housing can be completely separated from the body 3 and can be connected to the body 3 by means of the plug-in connection similar to the connection between a plug and a plug socket. An electrical connection contact adapter is provided in the electrical connection section 6 of the flash memory 4 and controller 2.

Figure 7:
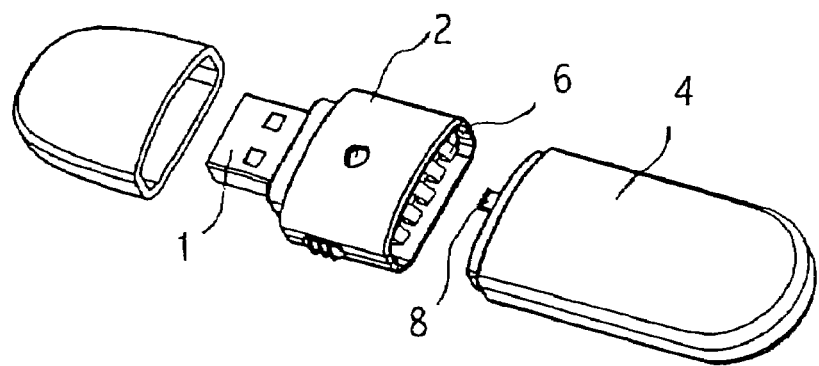
FIG. 7 is an exploded explanatory diagram showing further embodiment of the present invention.
Figures 8, 9:
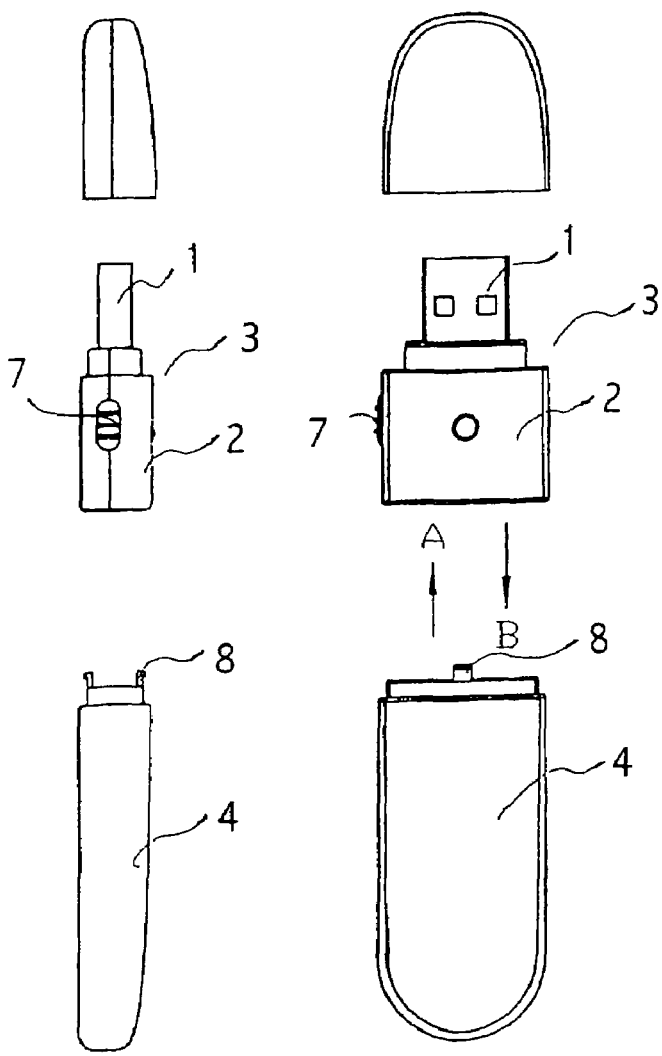
FIG. 8 is a diagram showing the structure of the side of the device shown in FIG. 7.
FIG. 9 is a diagram showing the structure of the front of the device shown in FIG. 7.

In addition, another embodiment of the present invention is shown in FIGS. 7, 8 and 9. In the embodiment, the flash memory part 4 is a self-housing independent part, whose housing can be completely separated from the body 3 and can be connected to the body by means of elastic fastener. A elastic clasp 8 is formed on the housing of the flash memory part 4, and a notch is formed on the body 3. The elastic clasp is set into the notch in conjugation status. An electrical connection contact adapter is provided in the electrical connection section 6 of the flash memory 4 and controller 2.

Finally, it should be noted that above embodiments are used only to explain the present invention, but not to limit the present invention. In despite of the detailed description of the present invention with reference to above preferred embodiments, it should be understand that various modifications, changes or equivalent replacements can be made by those skilled in the art without depart from the spirit and scope of the present invention, which should be covered in the append claims of this application.

The invention claimed is:

1. An USB removable memory with replaceable storage medium for optional upgrade and extension of the storage capacity, including an USB connector, a controller and a replaceable flash memory, characterized in that: said USB connector and said controller are integrated as a memory body, and said memory body does not include any built-in flash memory; the replaceable flash memory as a physically-independent storage component is replaceably and directly attached to the memory body; wherein said replaceable flash memory is placed within a chamber of the memory body and the chamber is covered by a dismountable back cover, and said replaceable flash memory is electrically connected to the controller for the controller to read from or to write to the flash memory, said replaceable flash memory is mounted on the memory body by means of plug-in connection or by means of tip-touch connection.

2. The USB removable memory with replaceable storage medium for optional upgrade and extension of the storage capacity according to claim 1, characterized in that: said dismountable back cover is mounted on the memory body by means of a guide channel.

3. The USB removable memory with replaceable storage medium for optional upgrade and extension of the storage capacity according to claim 1, characterized in that: said dismountable back cover is mounted on the memory body by means of clasp.

4. The USB removable memory with replaceable storage medium for optional upgrade and extension of the storage capacity according to claim 1, characterized in that: said memory body is provided with write/read status control switch whose control terminal is connected with a lead wire of the controller.

* * * * *